(12) United States Patent
Ivanov

(10) Patent No.: US 6,509,795 B1
(45) Date of Patent: Jan. 21, 2003

(54) CMOS INPUT STAGE WITH WIDE COMMON-MODE RANGE

(75) Inventor: Vadim V. Ivanov, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/965,523

(22) Filed: Sep. 26, 2001

(51) Int. Cl.[7] ................................................. H03F 3/45
(52) U.S. Cl. ....................... 330/253; 330/258; 330/259; 330/261
(58) Field of Search ................................ 330/253, 258, 330/259, 261

(56) References Cited

U.S. PATENT DOCUMENTS

| 4,333,058 A | 6/1982 | Hoover |
| 4,357,578 A | 11/1982 | Yokoyama |
| 4,377,789 A | 3/1983 | Hoover |
| 4,532,479 A | 7/1985 | Blauschild |
| 4,555,673 A | 11/1985 | Huijsing |
| 5,311,145 A | 5/1994 | Huijsing |
| 5,371,419 A | 12/1994 | Sundby |
| 5,500,624 A | 3/1996 | Anderson |
| 5,550,510 A | 8/1996 | Nagaraj |
| 5,777,514 A | 7/1998 | Mittal |
| 5,808,513 A | 9/1998 | Archer |
| 5,844,434 A | 12/1998 | Eschauzier |
| 5,929,705 A | 7/1999 | Zhang |
| 6,043,708 A | 3/2000 | Barr |

FOREIGN PATENT DOCUMENTS

JP        40420305     * 7/1992

OTHER PUBLICATIONS

Huang et al. Design of a CMOS Differential Amplifier and its Applications in A/D and D/A Converters. 1994 IEEE Asia–Pacific Conference on Circuits and Systems APCCAS '94 pp 478–483.*
Website: http://www.0,1824,productsm_ProductSummary_BasePartNumber%253DMC33502,00.htm; title: "Device MC33502 One Volt SMARTMOS Rail–to–Rail Dual Operational Amplifier;" printed May 25, 2001; 18 pages.
Torsten Lehmann and Marco Cassia; title: "Ultra–low Voltage CMOS Cascode Amplifier"; 4 pages.

* cited by examiner

Primary Examiner—Michael B Shingleton
(74) Attorney, Agent, or Firm—W. Daniel Swayze, Jr.; W. James Brady; Frederick J. Telecky, Jr.

(57) ABSTRACT

A different amplifier with rail-to-rail input including a single differential transistor pair utilizes a feedback circuit to control the threshold voltage of the differential transistor pair in accordance with the common mode voltage. The threshold voltage is controlled by adjusting the body bias coefficient with respect to the base to source voltage of the transistors.

14 Claims, 4 Drawing Sheets

CMOS INPUT STAGE WITH WIDE COMMON-MODE RANGE

FIELD OF THE INVENTION

The present invention relates to rail-to-rail input common mode range differential amplifiers, and more particularly to a CMOS input stage with wide common-mode range.

BACKGROUND OF THE INVENTION

In many areas of the electronics industry, such as the portable electronics industry, designers are turning toward lower operating voltages. This enables electronic circuit designers to design systems with smaller power supplies, which in turn reduces product weight and size, and increases the life expectancy of the system DC power supply.

However, while reduced operating voltages are beneficial in reducing product size and extending useful battery life, the lower voltages typically adversely affect circuit operation. For example, as circuit supply voltages are reduced, the range of circuit signal voltages which are available is also reduced. The reduced range of operating voltages is especially a concern for designers of operational amplifiers, such as differential amplifiers having a differential input stage.

The design and operation of conventional differential amplifiers is well known. The input stage of the differential amplifier typically includes an upper and lower supply rail, where the input stage further comprises one or more differential transistor pairs with associated current source(s). In addition, the input stage has a common-mode input voltage which defines the voltage range within which the input stage of the amplifier operates. The common-mode input voltage may typically be measured between the upper or lower supply rail of the input stage and the gate or base of one of the transistors, and is sometimes called the rail-to-rail voltage.

It is the goal of differential amplifier designers to design an operational amplifier with an input stage capable of operating over the full range of the common mode voltage. As noted above, however, where the circuit supply voltages are reduced, the range of circuit signal voltages over which the input stage of amplifier may operate is also reduced, which deteriorates the overall effectiveness of the amplifier's operation.

In that regard, designers have attempted to design circuitry such that supply voltages will not be less than the transistor saturation voltage plus the transistor gate to source voltage (e.g., $V_{sat}+V_{gs}$). By manipulating the circuit supply voltage in this manner, the circuit transistors are provided sufficient "headroom" to operate. On the other hand, the effect of reducing the supply voltages is that the gate to source voltage $V_{gs}$ of the transistor which makes up the input stage of the amplifier will also be reduced.

As used herein, headroom may be defined as the capacity to accommodate an input signal swing without driving an amplifier into saturation or into a non-linear operating region. Where the headroom occupies a larger fraction of the voltage supply range, the available common-mode input voltage range and the operating range of the input stage decreases. That is, where a differential amplifier is forced to extend beyond this narrow range of common-mode voltages, the differential-mode gain may drop off sharply, sometimes to zero. As a result, the differential amplifier may typically operate only over a relatively narrow range of common-mode input voltages.

To extend the common mode operating range, conventional amplifiers are often designed with a rail-to-rail input stage using depletion type transistors. One such rail-to-rail input stage amplifier is currently being produced by ON Semiconductor, Semiconductor Components Industries, LLC as part number MC33502. The MC33502 amplifier uses a single pair of depletion transistors to form a differential input stage. The general operation of the MC33502 part may be understood with reference to FIG. 1, below.

FIG. 1 shows an example of a conventional rail-to-rail input common mode range differential amplifier 10, as described in U.S. Pat. No. 5,808,513 issued Sep. 15, 1998 to Archer (hereinafter "Archer"). Archer purports to provide a rail-to-rail common mode range differential amplifier which operates on rail-to-rail voltages down to approximately one volt.

As shown in FIG. 1, amplifier 10 includes a current source 12 that outputs a tail current $I_T$, a differential pair 14 having depletion-type transistors M1 and M2 which output first and second intermediate currents, $I_{M1}$, and $I_{M2}$, and an active or passive load that amplifies the difference in magnitude between the first and second intermediate currents $I_{M1}$, and $I_{M2}$. In this conventional construction, amplifier 10 may vary the magnitude of the first and second intermediate currents $I_{M1}$, and $I_{M2}$ in response to the voltage difference between the differential inputs $V_{IN}^+$ and $V_{IN}^-$.

One problem with utilizing depletion-type transistors M1 and M2, however, is that as the supply voltage is reduced, the effective change in the threshold voltage due to the body effect becomes less and less. Thus, for example, where the threshold voltage effectively drops from 0.5 volts to −0.5 volts for a rail-to-rail voltage of 3 volts, the effective change for a rail-to-rail voltage of only 1 volt may only be seen as a change of 0.5 volts to 0.1 volts. This, in turn, widens the amplifier headroom and lowers t he common-mode range of the amplifier design.

Further, with respect to the construction of the ON Semiconductor part MC33502 which uses depletion-type transistors, a special production process is required which typically includes supplementing the circuit with additional implants. That is, there is a need to add additional diffuision ion-implanting steps to the process to provide a thin channel-type layer under the gate of the MOS transistor. Consequently, as should be understood, the reduced common-mode range and the added complexity of the special production process make the rail-to-rail differential amplifier constructions of the ON Semiconductor part MC33502 and the Archer patent less desirable to use.

Another well known rail-to-rail input stage differential amplifier construction is described in U.S. Pat. No. 4,555,673 issued Nov. 26, 1985 to Huijsing et al. (hereinafter "Huijusing"). Huijusing purports to describe an amplifier that operates between first and second supply voltages where the range for the power supply voltages, $V_{PS}$, is divided into three sub-ranges. A first end sub-range of the invention is described as extending from the first supply voltage to a specified voltage between the supply voltages. The middle sub-range extends from the first specified voltage to a second specified voltage between the first specified voltage and the second supply voltage, and the second end sub-range extends from the second specified voltage to the second supply voltage.

To operate over the different ranges, Huijsing requires a switching of the operation currents depending on the differential portion used as the common mode voltage, $V_{CM}$, enters the end range, where the input transistors in that differential portion are non-conductive. Further, the switching of the operating currents is purportedly done with one or more steering transistors differentially configured with respect to one or both pairs of input transistors. The supply lines for the other differential portion are then purportedly provided with current that is derived from current diverted away from the supply lines for one of the differential portions.

The switching involved in Huijsing, however, is undesirable in that it typically damages the common-mode CMRR. This occurs because the NMOS and PMOS transistors of the input stages have different offset voltages which require the switching point amplifier to rapidly change the offset voltage. The consequence of the rapid switching by the amplifier results in a low CMRR.

Accordingly, a need exist to provide a differential amplifier with a rail-to-rail input stage which provides a wide common-mode range, does not involve added complexities or require excessive switching, and additionally operates within very low voltage (e.g., 0.9–3.6V). supply range without damaging the gain of the differential amplifier input stage.

SUMMARY OF THE INVENTION

The method and circuit according to various aspects described herein addresses many of the shortcomings of the prior art. As discussed above, previous approaches for extending the operational range of the differential amplifiers with rail-to-rail input stage over the common-mode input voltages involve, inter alia, complex manufacturing techniques and/or have difficulty in maintaining a stable CMRR and input stage gain due to, complex switching techniques. However, in accordance with various aspects of the present invention, an operational amplifier is configured using a rail-to-rail input stage with single input pair, which avoids the problems found in the prior art.

The input stage transistors may be biased in accordance with the value of the common mode voltage. For example, where the common mode voltage $V_{CM}$ nears the low voltage rail, the bodies of the input transistors are biased by the voltage drop across a diode structure and the transistor base to source voltage, $V_{bs}$. Contrarily, where the common mode voltage $V_{CM}$ is near the high voltage rail, the base to source voltage $V_{bs}$ value is at a value near the low voltage rail which provides sufficient headroom for the operation of the attached load or next amplifier stage.

In accordance with one aspect of the present invention, an operational amplifier with a differential input stage is provided which operates on a voltage supply of from approximately 0.9 Volts with a high common-mode rejection rate.

In accordance with one exemplary embodiment of the present invention, an amplifier with rail-to-rail differential input stage uses a single input NMOS differential pair. The common mode voltage value is provided to the body nodes of the NMOS differential pair which uses input common-mode voltage feedback to control the input differential pair body voltage. In this way, the relationship of the body-bias of the differential NMOS pair may be exploited to reduce the effective headroom of the differential pair and increase the common mode input voltage range.

In according with another aspect of the present invention, a body-bias voltage is used to control the threshold of the MOS transistors, where the body-bias voltage is dependent on the common-mode voltage of the transistor.

BRIEF DESCRIPTION OF DRAWINGS

A more complete understanding of the present invention may be arrived at by referring to the various exemplary embodiments which are described in conjunction with the appended drawing figures in which like numerals denote like elements, and in which.

DETAILED DESCRIPTION OF VARIOUS EXEMPLARY EMBODIMENTS

The various embodiments described herein may be described in terms of various functional components and various processing steps and stages. It should be appreciated that such functional components may be realized by any number of hardware or structural components configured to perform the specified functions. For example, the various embodiments may employ integrated components comprised of various electrical devices, e.g., resistors, transistors, capacitors, diodes and the like, whose values may be suitably configured for various intended purposes. In addition, the various embodiments may be practiced in any integrated circuit application in which operational amplifiers are utilized. Such general applications that may be appreciated by those skilled in the art in light of the present disclosure are not described in detail herein. However, for purposes of illustration only, the various exemplary embodiments will be described herein in connection with operational amplifiers containing a differential input stage.

Further, it should also be appreciated that the particular implementations shown and described herein are illustrative examples of the various embodiments and are not intended to otherwise limit the scope of the disclosure in any way. Indeed, for the sake of brevity, conventional electronics, transistors, differential amplifiers and other functional aspects of the various embodiments (and components of the individual operating components of the various embodiments) may not be described in detail herein. Furthermore, the connecting lines shown in the various figures contained herein are intended to represent functional relationships and/or physical or logical couplings between the various elements. It should be noted that many alternative or additional functional relationships, physical connections or logical connections may be present in a practical differential amplifier construction, and as such, are contemplated to be within the scope of the embodiments described herein. Further still, it should be noted that while various components may be suitably coupled or connected to other components within the exemplary circuits described herein, such connections and couplings can be realized by direct connection between components, or by connection through other components and devices located therebetween. Moreover, no item or component is essential to the practice of the invention unless the element is specifically described as "essential" or "critical."

Figure 1:
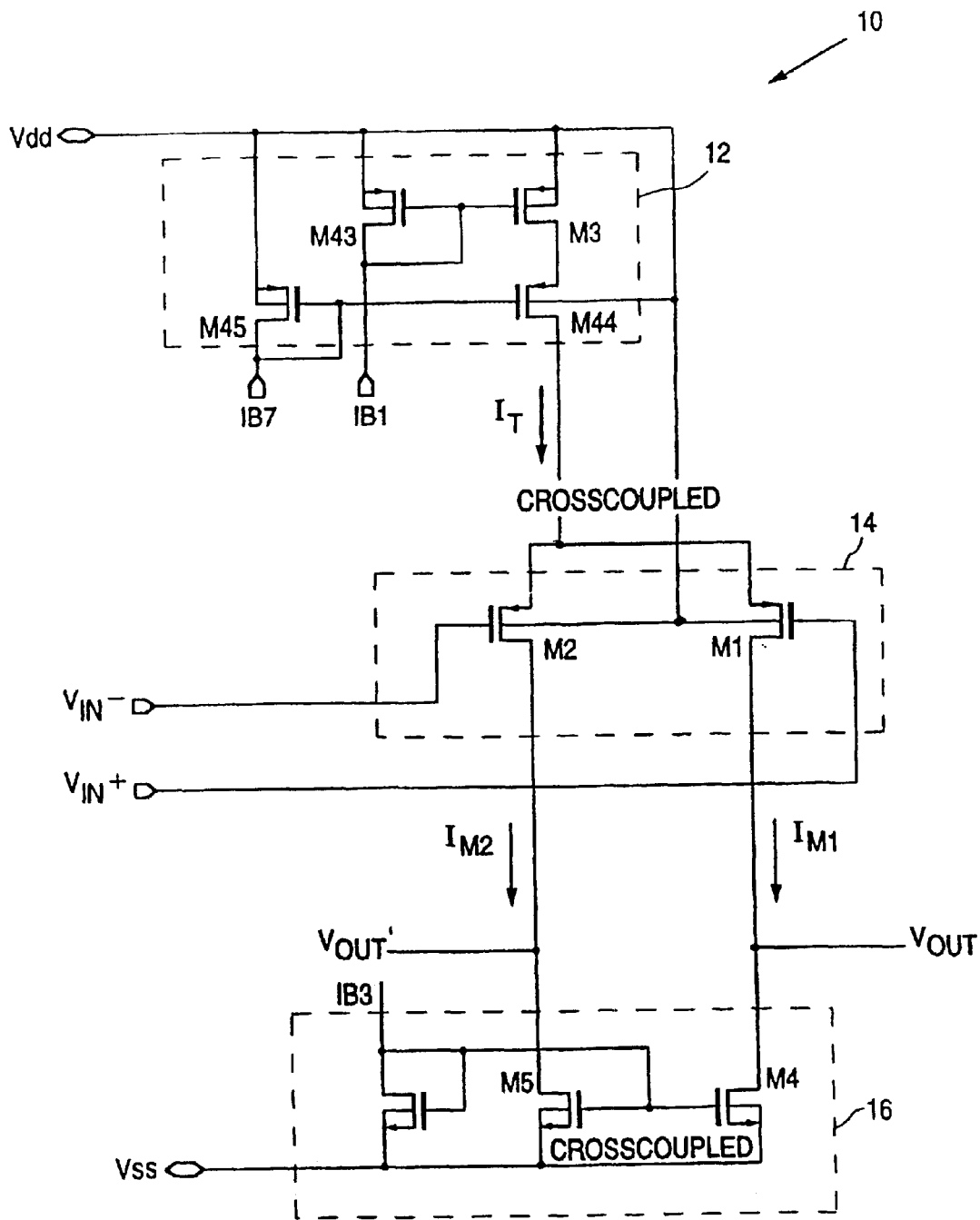
FIG. 1 is aschematic representation of a prior art embodiment of an operational amplifier a rail-to-rail input stage including a single input pair.
Figure 2:
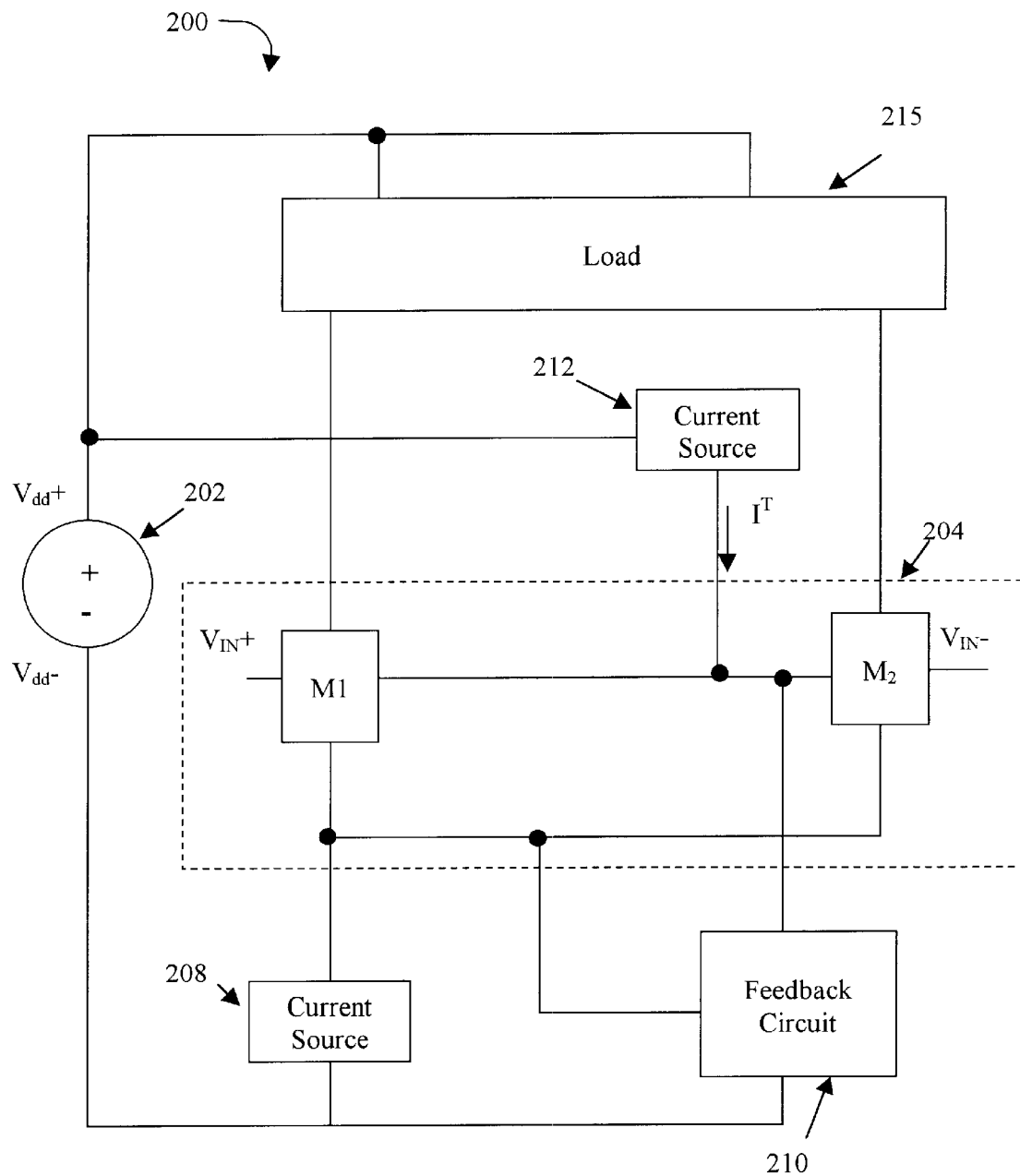
FIG. 2 is a block representation of an operational amplifier with a rail-to-rail input stage including a single input pair in accordance with an exemplary embodiment of the present invention.

FIG. 2 shows a block diagram of a rail-to-rail input common mode range differential amplifier 200 in accordance with various exemplary embodiments of the present invention. As described in greater detail below, amplifier 200 operates at very low rail-to-rail voltages $V_{dd+}$ and $V_{dd-}$ provided by a voltage source stage 202 by utilizing a differential amplifier comprising a pair of differential transistors 204. As shown, differential amplifier 200 includes a voltage source 202 connected to a current source 212 and a load 215. The current source 212 may be further connected to differential transistor pair 204, such that a tail current $I_T$ may be provided to the base nodes of transistors $M_1$ and $M_2$. Transistors $M_1$ and $M_2$ may be configured such that the drain of transistors $M_1$ and $M_2$ may be connected to load 215 and the source node of transistors $M_1$ and $M_2$ may be connected to a current source 208 and a feedback circuit 210. That is, the output of the differential input stage may be connected to load 215, for example, in similar manner as described with respect to the load 16 of FIG. 1. The output of feedback circuit 210 may be further provided to base nodes of transistors $M_1$ and $M_2$.

Voltage source 202 may be any suitable source for providing rail-to-rail voltages ($V_{dd+}$ and $V_{dd-}$) to differential transistor pair 204. In particular, the voltages $V_{dd+}$ and $V_{dd-}$ may be used to define the rail-to-rail common mode range of amplifier 200. That is, $V_{dd+}$ and $V_{dd-}$ may define the upper and lower voltage limits of operation of differential transistor pair 204.

Amplifier 200 may also include a first current source 208 and a second current source 212. Current sources 208 and 212 may be of any conventional construction for providing a constant current. For example, current sources 208 and 212 may be any conventional current source configured to provide sufficient current such that at least one of differential transistor pair 204, including transistors M1 and M2, remains conductive. Typical current sources for use with differential operational amplifiers are well known in the art, and as such, will not be discussed in great detail herein.

Differential transistor pair stage 204 may be any differential transistor pair M1 and M2 capable of receiving input voltages $V_{IN+}$, and $V_{IN-}$ and providing an output current within the common mode range. Typical transistors which may be used with this invention include, for example, any conventional NMOS or PMOS transistors suitable for use in a differential pair.

Feedback circuit stage 210 may be any conventional circuit capable of providing the input common mode voltages as feedback to the bodies of transistors M1 and M2, and for shorting the bodies of transistors M1 and M2 to the low voltage rail at a predetermined voltage. It should be understood, as well, that the functions of providing voltage feedback and shorting may be accomplished with more than one circuit construction for example, the shorting function of feedback circuit stage 210 may be performed using any conventional shorting circuitry, such as a diode. That is, feedback circuit stage 210 may comprise a diode connected BJT, a diode connected MOS, a diode construction, or any conventional component arrangement capable of providing the short at a predetermined voltage level. In addition, the diode may be arranged independently of the accompanying feedback circuitry. The feedback circuit stage 210 may further include a circuit for ensuring that the included diode structure is capable of sending the diode to short, such as, as suitable transistor (e.g., CMOS) connected to the diode to turn the diode on and off in accordance with the common mode voltage provided.

As noted with respect to FIG. 2, in accordance with an exemplary embodiment, the upper rail $V_{dd+}$ of operational amplifier 200 may be connected to a load 215 of the differential transistor pair M1 and M2 and to current source stage 212. The body nodes of transistors M1 and M2 may be coupled together and further coupled to current source stage 212. The body nodes may additionally be connected to the negative rail through feedback circuit stage 210. Where a diode or similar construction is used, the body nodes of transistors M1 and M2 may be connected to the negative rail through such diode construction. In addition, the source nodes of transistors M1 and M2 may be coupled and connected to the lower rail $V_{dd-}$ via current source stage 208, and may be coupled to feedback circuit stage 210, which is also connected to the lower rail $V_{dd-}$ and to the bodies of transistors M1 and M2.

Figure 3:
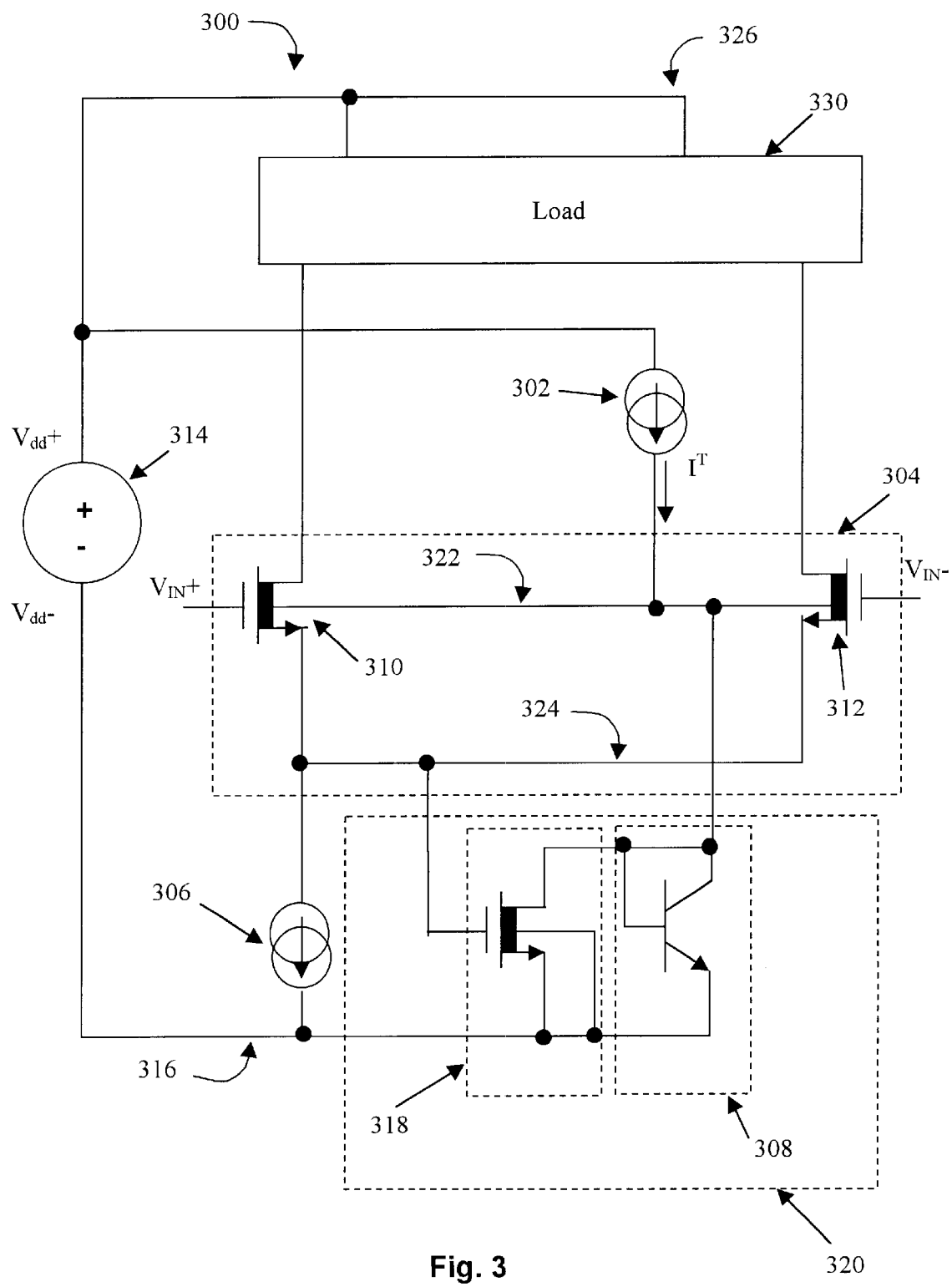
FIG. 3 is a schematic representation of an operational amplifier with a rail-to-rail input stage including a single input pair in accordance with another exemplary embodiment of the present invention.

The operation of the various exemplary embodiments may be understood by way of example with respect to FIG. 3, wherein an exemplary rail-to-rail input common mode range differential amplifier 300 is illustrated using a single input CMOS differential pair with feedback control of transistor body bias voltage. In this example, NMOS transistors of NPN construction are considered to have a voltage threshold $V_{th}$ of about 0.8 volts. It should be noted, however, that the embodiment depicted is not to be so limited. For example, it should be understood that the embodiment could be depicted using PMOS transistors with low voltage threshold, $V_{th}$, of from about 0.3 volts and preferably, of from about 0.2 volts. Alternatively, the embodiment could be depicted using NMOS transistors with a low voltage threshold, $V_{th}$, of from about 0.25 volts and preferably, of from about 0.15 volts. One such suitable transistor for use with this exemplary embodiment is produced by Texas Instrument as part number 33a12. Further, it should be noted that the low threshold voltage transistors described above are not limited by the requirement of additional process steps as found in the prior art. However, it should be understood that other conventional non-low voltage threshold transistors requiring additional processing may be used in the present embodiment.

FIG. 3 depicts another exemplary embodiment of a CMOS input stage differential amplifier system 300 with wide common mode range in accordance with the present invention. Amplifier system 300 includes a load 330, current sources 302 and 306, a differential transistor pair 304, a feedback circuit 320, and a voltage source 314 for providing rail currents $V_{dd+}$ and $V_{dd-}$. Differential transistor pair 304 further includes a differential pair of transistors 310 and 312, and feedback circuit 320 further includes a current mirror 308 and transistor circuit 318 for reflecting the common mode voltage $V_{CM}$ of the differential amplifier system 300 and providing the common mode voltage $V_{CM}$ to current mirror 308.

As shown, voltage source 314 is suitably connected to current source 302, and further connected to the drains of transistors 310 and 312 via node 326 and load 330. Further, current source 302 may be connected to the base nodes of transistors 310 and 312, and the source nodes of transistors 310 and 312 may be connected to current source 306 and the gate of transistor circuit 318 via node 324. In addition, the base of current mirror 308 may be connected to the drain of transistor circuit 318 and to the base nodes of transistors 310 and 312, while the emitter of current mirror 318 and the source of transistor circuit 318 may be connected to the negative terminal $V_{dd-}$ of voltage source 314 at node 316. Additionally, $V_{IN+}$ may be suitably connected to the gate of transistor 310 and $V_{IN-}$ may be suitably connected to the gate of transistor 312 for providing differential voltage to transistor pair 304.

It should be noted that current sources 302 and 306 and differential pair 304 may be of similar description and construction as like elements described with respect to FIG. 2. Also, similar to as was noted with respect to feedback circuit 210 of FIG. 2, feedback circuit 320 may consist of any conventional circuit capable of providing a short between the bodies of transistors 310 and 312.

Feedback circuit 320 may include a transistor circuit 318 configured to reflect the base to source voltages $V_{bs}$ of transistors 310 and 312 and provide the base to source voltages to current mirror 308. As depicted, circuit 308 may be a diode connected bipolar junction transistor configured to perform like a diode, or any similar diode construction capable of providing a short to the bodies of transistors 310 and 312 at a calculable or determinable current level. In addition, although transistor circuit 318 is depicted using a MOS transistor, transistor circuit 318 may be any suitable circuit for reflecting the common mode voltage $V_{CM}$ of the differential amplifier 300 and providing the common mode voltage $V_{CM}$ to current mirror 308.

As noted, the source of transistors 310 and 312 may be coupled together (e.g., cross coupled) at node 324, which is further connected to the lower rail $V_{dd-}$ via current source 306. Cross coupled source nodes of transistors 310 and 312 may be further suitably coupled to the gate of transistor circuit 318 via node 324. In addition, the body and source nodes of transistor 318 may be connected to the lower rail $V_{dd-}$ via node 316.

To more fully understand the operation of the various embodiments described herein, it may be assumed that supply voltage between $V_{dd+}$ and $V_{dd-}$ may be of about 0.9 volts, although it should be understood that the various embodiments are not to be so limited. That is, other rail-to-rail voltages are contemplated to be within the scope of the embodiments, such as for example, the maximum drain-source voltage $V_{ds}$ for which transistors 310, 312 are configured.

As described above, differential voltages $V_{IN+}$ and $V_{IN-}$ may be configured such that the voltages may provide differential voltages at the gates of transistors 310 and 312. In particular, $V_{IN+}$ and $V_{IN-}$ may be of sufficient value for ensuring that transistors 310 and 312 may operate in the transistor active region. More particularly, $V_{IN+}$ and $V_{IN-}$ may be such that the transistor 310, 312 gate to source voltage, $V_{gs}$, is greater that the transistor voltage threshold $V_{th}$ at any one time during the operation of the amplifier.

Although, the rail-to-rail common mode range of amplifier system 300 can accommodate a variety of ranges, the following discussion of the operation of amplifier system 300 is based on a supply voltage of 0.9 volts for illustrative purposes only. The various embodiments described herein are configured to take advantage of dependency of the transistor voltage threshold on the body bias effect which is determined with respect to the common-mode voltage. Such a configuration can be effective since the transistor threshold voltage $V_{th}$ may be approximated by the following equation (1) where $V_{bs}$ ("body bias voltage"), γ("body-bias coefficient") and φ("transistor surface potential") are greater than zero, and where $V_{th0}$ is the zero body bias threshold:

$$V_{th}=V_{th0}+\gamma(\sqrt{2\phi-V_{bs}}-\sqrt{2\phi}). \quad (1)$$

Thus, the transistor voltage threshold $V_{th}$ may well be controlled by body-biasing the transistor body during operation. In addition, the illustrative example is further based on transistors 310 and 312 which are of the low-$V_{th}$ type with $V_{th0}$=0.15 volts with zero body-bias voltage, body-bias coefficient, γ≈0.5, and surface potential φ≈0.35 volts.

Using equation (1) and the above noted transistor parameters, it can be seen that where $V_{CM}$≈0, the bodies of transistors 310 and 312 may be biased by base to emitter voltage $V_{be}$ voltage across current mirror 308, the body to source voltage of the transistors $V_{bs}$≈0.6V, and transistor threshold voltage $V_{th}$≈−50mV. In addition, as should be understood, by simulating the characteristics of the amplifier system 300 under varying temperature conditions, the transistor threshold voltage $V_{th}$ of transistors 310 and 312 will vary from −20 to −200 mV, which in turn provides sufficient headroom for the operation of the current source 302. Further, when common mode voltage, $V_{CM}$, is close to the lower rail $V_{dd-}$ of 0.9 volt minimum supply, the transistors 310 and 312 body to source voltages $V_{bs}$=−0.9 volts, and the simulation of the characteristics of the amplifier 300 under varying temperature conditions indicates a transistor threshold voltage $V_{th}$ of transistors 310 and 312 that varies from approximately 200 mV to 400 mV This, in turn, provides sufficient headroom for the operation of the load 330.

In addition, as can be seen from applying the transistor parameters above to equation (1), when the common-mode input voltage is high (e.g. above 0.4–0.5 V) the source voltage of the transistors 310 and 312 may be above 0.2–0.3 V, which forces the gate of the transistor circuit 318 high. As noted with respect to FIG. 2, when the gate of transistor circuit 318 is high, the current mirror 308 will short the bodies of transistors 310 and 312 to the negative supply rail. The body to source voltage $V_{bs}$ of transistors 310 and 312 may then increase which, in turn, increases the threshold voltages $V_{th}$ and the gate to source voltage $V_{gs}$ of the transistors. Alternatively, when the common-mode input voltage reaches positive supply rail, the drain to source voltage $V_{ds}$ of transistors 310 and 312 will become equal to the gate to source voltage $V_{gs}$ of the transistors minus the voltage drop across the attached load $V_{load}$ (e.g. $V_{gs}-V_{load}$). Consequently, transistors 310 and 312 will typically not enter the triode region of operation, but instead will operate in saturated region providing that the gate to source voltage $V_{gs}$ minus the voltage threshold $V_{th}$ is less than the drain to source voltage $V_{ds}$, $V_{gs}-V_{th}<V_{ds}$, and consequently, the gain of the input stage remains constant.

Further, when common-mode voltage is close to the negative supply rail, the voltage at the source node of transistors 310 and 312 will be low (e.g. less than $V_{th}$ of transistor circuit 318), so that the transistor circuit 318 is in the cut off region and transistor base to source voltage $V_{bs}$ of transistors 310 and 312 will be approximately equal to the base to emitter voltage $V_{be}$ transistor 308 (e.g., approximately 0.5–0.7 V), depending on the temperature of the overall system and current provided by current source 302. In this case the voltage threshold of the transistors $V_{th}$ may be negative.

Moreover, the gate to source voltage $V_{gs}$ also may be negative providing headroom for the operation of current source 306. As such, the common-mode input voltage may change from rail to rail while the current provided to the differential pair 304 by current source 306 stays constant and transistors 310 and 312 may operate in saturation region providing constant gain of the input stage.

Therefore, as can be seen, the embodiment described widens the common mode range while leaving the gain unchanged. The exemplary embodiment also widens the common mode range without the need of a second complementary input pair of transistors and/or current switching components as required in the prior art.

Figure 4:
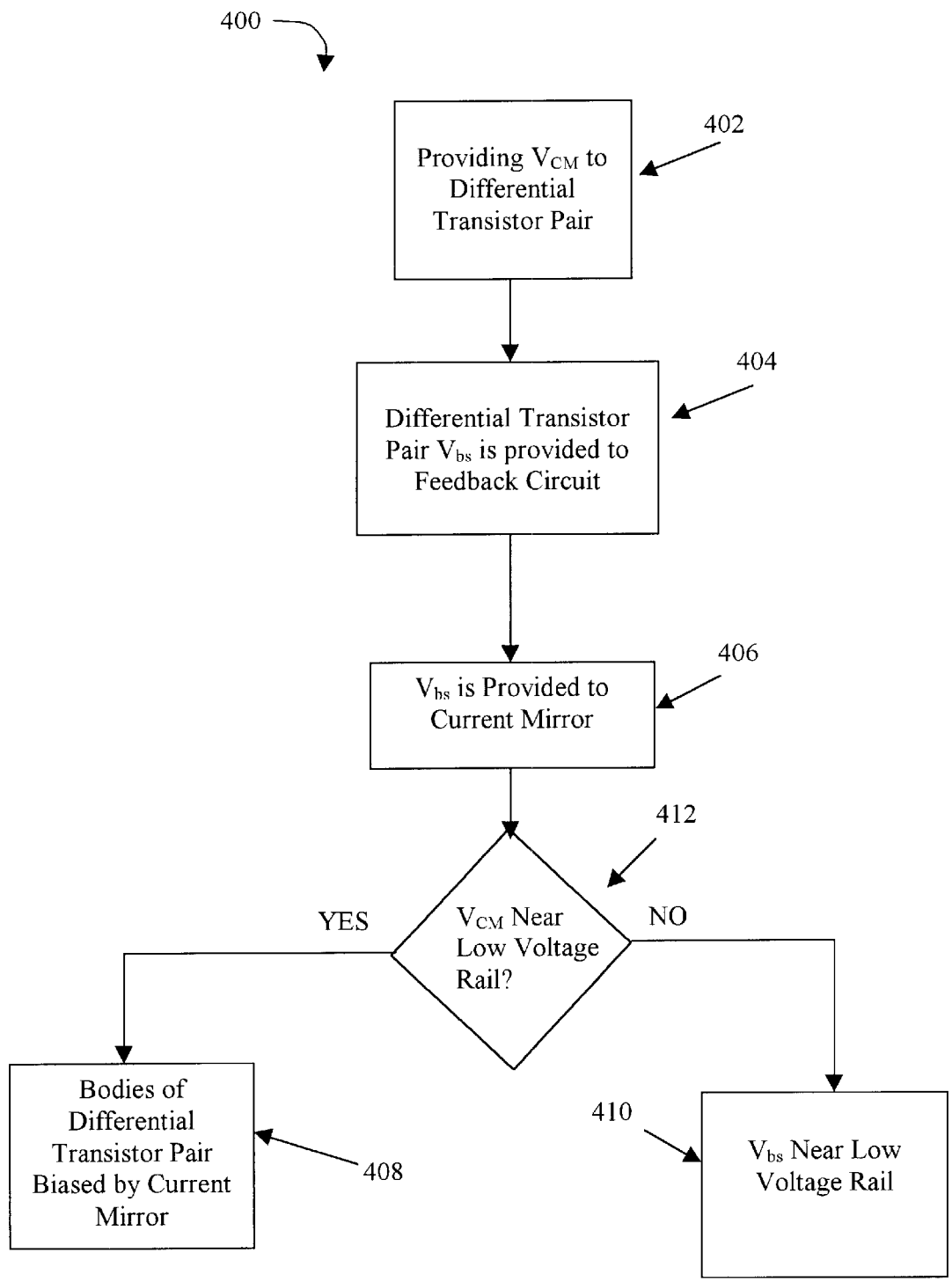
FIG. 4 is a block representation of an exemplary method for implementing an exemplary embodiment of the present invention.

The present invention may be further understood with reference to FIG. 4 and continued reference to FIG. 3, wherein the operational steps of the invention are illustrated. As noted above, a rail-to-rail common mode voltage is provided to the differential pair 304 (step 402). Differential pair 304 then provides a base to source voltage to the feedback circuit 320 (step 404) which includes a first circuit transistor 318 for reflecting the base to source voltage and a second diode circuit current mirror 308 receiving the reflected base to source voltage (step 406). Once the common mode voltage $V_{CM}$ nears the low voltage rail (step 412), the bodies of the differential transistor pair 304 are biased by the voltage drop across the current mirror 308 (step 408). Contrarily, where the common mode voltage $V_{CM}$ nears the high voltage rail (step 412), the base to source voltage is near the low voltage rail which provides sufficient headroom for the operation of the attached load or next amplifier stage 330 (step 410).

The present invention has been described above with reference to various exemplary embodiments. However, it should be understood that changes and modifications may be made to the exemplary embodiments without departing from the scope of the present disclosure. For example, the various components may be implemented in alternate ways, such as, for example, by providing additional or fewer current mirrors, or additional amplifier stages. Further, the differential amplifier disclosed herein can also include additional elements which may be necessary for the operation of the amplifier, or include various different components of like operation as those described herein. For example, a negative and/or a positive supply regulator may be included and suitably configured to limit, filter or otherwise regulate the internal supply rails. In addition, for embodiments including various current mirrors, the devices can be configured to operate at various frequencies and other operating parameters. It should be understood that the configuration of the differential amplifier (e.g., transistors), implemented may be suitably selected depending upon the particular application or in consideration of any number of factors associated with the operation of the system. (e.g., the supply voltage, the output voltage, output current, requirements of the receiving load or process). Moreover, these and other changes or modifications are intended to be included within the scope of the present invention, as expressed in the following claims.

What is claimed is:

1. A rail-to-rail input common mode range differential amplifier with common mode voltage input and differential voltage input for amplifying a voltage difference between a pair of differential inputs, the amplifier comprising:
    a first current source for providing a tail current;
    a differential transistor pair for receiving said tail current, said differential transistor pair further providing at least one of a current difference output and a base to source voltage;
    a second current source for receiving said base to source voltage and for providing a constant current output; and
    a feedback circuit for receiving said base to source voltage and for body biasing said differential transistor pair in accordance with a common mode voltage input.

2. An amplifier according to claim 1, wherein said differential transistor pair comprises a first differential transistor and a second differential transistor.

3. An amplifier according to claim 2, wherein said feedback circuit comprises a first circuit configured to reflect said base to source voltage and a second circuit configured to provide a short at a body to base voltage of said differential transistor pair.

4. An amplifier according to claim 3, wherein said first circuit provides said base to source voltage to said second circuit.

5. An amplifier according to claim 4, wherein said second circuit biases said differential transistor pair in accordance with said common mode voltage input.

6. A differential amplifier with voltage input for amplifying a voltage difference between a pair of differential inputs, the amplifier comprising.
    a current source for providing a tail current;
    a differential transistor pair for receiving said tail current, said differential transistor pair further providing at least one of a current difference output and a base to source voltage; and
    a feedback circuit for receiving said base to source voltage and for providing body biasing of said differential transistor pair in accordance with a common mode voltage input.

7. An amplifier according to claim 6, wherein said feedback circuit comprises a first circuit configured to reflect said base to source voltage and a second circuit configured to provide a short at a body to base voltage of said differential transistor pair.

8. An amplifier according to claim 7, wherein said first circuit provides said base to source voltage to said second circuit.

9. An amplifier according to claim 8, wherein said second circuit biases said differential transistor pair in accordance with said common mode voltage input.

10. A rail-to-rail input common mode range differential amplifier with voltage input for amplifying a voltage difference between a pair of differential inputs, the amplifier comprising:
    a first current source for providing a tail current;
    a differential transistor pair for receiving said tail current, said differential pair comprising a first differential transistor and a second differential transistor, for providing a base to source voltage and a difference current output; and
    a feedback circuit for receiving said base to source voltage and body biasing said first differential transistor and said second differential transistor in accordance with a common mode voltage input, said feedback circuit comprising a first circuit and a second circuit.

11. An amplifier according to claim 10, wherein said first circuit provides said base to source voltage to said second circuit.

12. An amplifier according to claim 11, wherein said second circuit body biases said first differential transistor and said second differential transistor in accordance with said base to source voltage.

13. An amplifier according to claim 12, wherein said second circuit is configured to provide a short circuit to said first differential transistor and said second differential transistor in accordance with said common mode voltage input.

14. A method for providing a rail-to-rail input mode differential amplifier with common mode voltage input for amplifying a voltage difference between a pair of differential inputs, the method comprising:
    measuring a rail-to-rail common mode voltage provided to a differential transistor pair, the differential pair configured to provide a base to source voltage responsive to a common mode voltage;
    providing the base to source voltage to a feedback circuit; and
    providing base to source feedback to bodies of the differential transistor pair for controlling the threshold voltage of the differential transistor pair.

* * * * *